US006592388B1

(12) United States Patent
Meiners et al.

(10) Patent No.: US 6,592,388 B1
(45) Date of Patent: Jul. 15, 2003

(54) NETWORK PROTECTOR LOCKING SPRING LOADED CONTROL CONNECTIONS

(75) Inventors: Steven E. Meiners, Beaver Falls, PA (US); Arthur J. Jur, Aliquippa, PA (US); Douglas M. Brandt, Ellwood City, PA (US); Stephen W. Oneufer, Cranberry Township, PA (US); Michael F. Magazine, Carnegie, PA (US)

(73) Assignee: Eaton Corporation, Cleveland, OH (US)

( * ) Notice: Subject to any disclaimer, the term of this patent is extended or adjusted under 35 U.S.C. 154(b) by 14 days.

(21) Appl. No.: 09/951,033

(22) Filed: Sep. 10, 2001

(51) Int. Cl.[7] ............................................... H01R 13/62
(52) U.S. Cl. ..................................................... 439/310
(58) Field of Search ................................. 439/310, 248, 439/131; 361/798; 312/223.1, 223.2

(56) References Cited

U.S. PATENT DOCUMENTS

| 4,602,829 | A | * | 7/1986 | De Andrea | ............... | 211/41.17 |
| 5,167,520 | A | * | 12/1992 | Henry et al. | ................ | 439/248 |
| 5,993,241 | A | * | 11/1999 | Olson et al. | ................ | 439/160 |
| 6,418,027 | B1 | * | 7/2002 | Suzuki et al. | ............... | 361/686 |

* cited by examiner

Primary Examiner—Lynn D. Feild
Assistant Examiner—P. Dinh
(74) Attorney, Agent, or Firm—Martin J. Moran

(57) ABSTRACT

A spring-biased electrical connector permits the connector to be moved into a retracted position for installation and removal of the components to which the connector is attached, and then extended to form an electrical connection with its mating connector. The spring-biased connector may be secured in electrical connection with its mating connector. Such a spring-biased connector is particularly useful for connecting a control relay to a network protector, although not limited to such use.

16 Claims, 9 Drawing Sheets

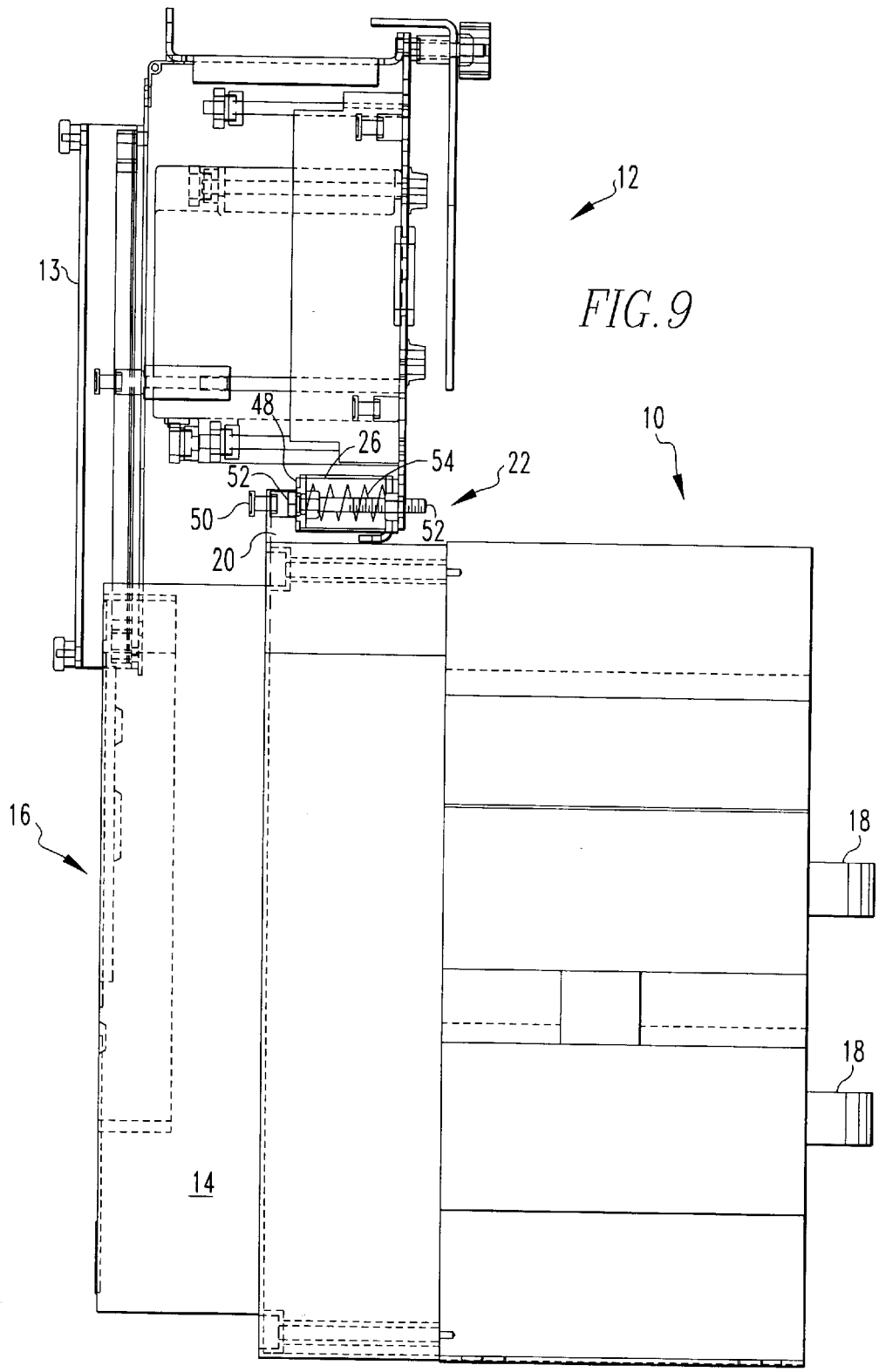

NETWORK PROTECTOR LOCKING SPRING LOADED CONTROL CONNECTIONS

BACKGROUND OF THE INVENTION

1. Field of the Invention

The present invention relates to control relays for network protectors. More specifically, the invention relates to a spring-biased electrical connector facilitating removal and reattachment of a control relay and its associated network protector.

2. Description of the Related Art

Network protectors are frequently installed in underground electrical systems, beneath busy streets. Such network protectors are typically used in power distribution systems for transmitting electrical power from a power generation plant to various residential and commercial buildings wherein the electrical power is used. The network protector includes a circuit breaker which will trip in the event of current flow in the wrong direction. The control relay will transmit information about the current status of the portions of the electricity distribution system protected by the network protector to a remote location. Each control relay monitors the flow of current through one portion of the network, operating independently to increase or decrease current flow as needed. In the event of problems within this portion of the distribution system, electrical power may thereby be routed through other network protectors of substantially the same type to compensate for power not transmitted through the network protector that has detected a problem. The central monitoring function permits locating and repairing problems that develop within the network.

These network protectors are typically rollout units, encompassing a circuit breaker and an electrical control relay in a single unit. Due to the harsh environment wherein such network protectors are located, they must be inspected and repaired frequently. Presently available circuit breakers and control relays are connected in a manner requiring removal of other components before the control relay can be removed.

Accordingly, there is a need for an electrical connector for use with the control relays of network protectors, permitting easy removal of the control relay from the network protector, without the need for removal of other components from the network protector.

SUMMARY OF THE INVENTION

The present invention is a connector for providing an electrical signal connector between a network protector and its associated control relay. The connector includes a connector bracket having at least one electrical connector portion, with the electrical connector portion typically being of one of the mating members of a male-female connector system. A preferred embodiment includes two male electrical connector portions. The connector bracket includes a pair of end portions. A pair of end braces are used to mount the connector on the component with which it will be used. The end braces are dimensioned and configured to permit a substantially linear translation-type movement of the bracket. A threaded bolt is secured to each end bracket, and a spring is located adjacent to each end portion, surrounding the bolt. Each end portion is dimensioned and configured to bear against the spring for biasing the connector towards an extended, connected position, and the threaded bolt for moving the connector bracket against the springs towards a retracted, disconnected when the bolt is turned. A captive screw is secured within each end brace, being dimensioned and configured to fit within a hole in each end portion of the connector for securing it in its extended position.

The connector of the present invention will typically be mounted on the control relay of a network protector. To attach the control relay to the network protector, the bolts are tightened to push the connector towards its rearward, disconnected position, against the force of the springs. The control relay may then be moved directly downward into position on the network protector, without the connectors striking its mating connector on the network protector. Loosening the bolts permits the springs to push the connector from its rearward, disconnected position to its forward, connected position, causing the connector of the present invention on the relay to become electrically connected with its mating connector on the network protector. The captive screws are then tightened, securing the connector in electrical connection with its mating connector.

Network protectors are frequently located in harsh environments such as within electrical systems beneath busy streets, wherein there is a frequent need to inspect and repair the network protector and its control relay. A typical network protector in such a location will be of the rollout type, with its control relay attached. A connector of the present invention permits the control relay to be easily removed from the network protector, without removal of other hardware, after the network protector is rolled out from its operating enclosure to a position wherein it is disconnected from electrical power.

It is therefore an aspect of the present invention to provide an electrical connector assembly wherein the electrical connector may reciprocate between a retracted portion permitting easy installation and removal of the component to which it is secured, and an extended position wherein the electrical connector may mate with a corresponding electrical connector.

It is another aspect of the present invention to provide a reciprocating electrical connection assembly that may be secured in its extended position, thereby preventing it from becoming disconnected from its mating connector unintentionally.

It is a further aspect of the present invention to provide a reciprocating electrical connector having at least one guide pin for ensuring proper alignment with the mating connector as it is moved from its retracted position to its extended position.

These and other aspects of the invention will become apparent through the following description and drawings.

BRIEF DESCRIPTION OF THE DRAWINGS

FIG. 9 is a partially exploded view of a network protector and control relay using a connector according to the present invention, showing the control relay connected to the network protector.

Like reference numbers denote like elements throughout the drawings.

DETAILED DESCRIPTION

The present invention is a connector capable of reciprocating between a retracted position, permitting easy installation of the component to which the connector is attached to another component to which it must be connected, and an extended position wherein it may mate with a mating connector. Although not limited to such use, such a connector is particularly useful for providing an electrical connection between a network protector and its associated control relay.

Figure 1:
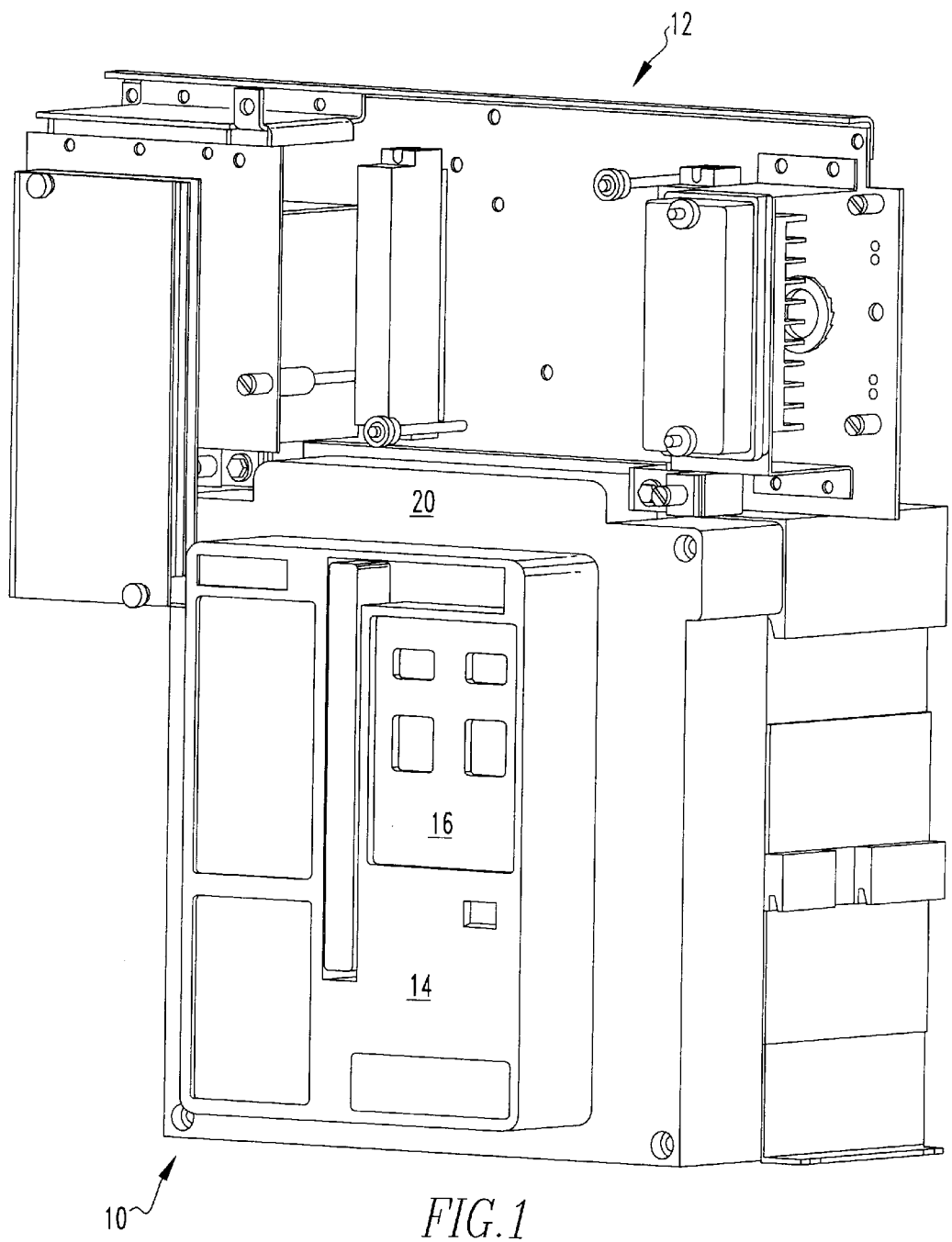
FIG. 1 is a front isometric view of a network protector and control relay utilizing a connector of the present invention.

Referring to FIGS. 1–2 and 8–9, a typical network protector 10, utilizing a control panel assembly 12 having a connector of the present invention secured to a control panel 13, is illustrated in FIG. 1. The network protector 10 generally includes a circuit breaker assembly 14. The circuit breaker assembly 14 includes the control panel 16, located on the front of the network protector 10, and a plurality of electrical connectors 18 on the back of the network protector 10 for connecting the circuit breaker 14 between the electrical power source and the electrical load. The network protector 10 also includes an electrical connector assembly 20, for forming an electrical connection with a control relay. The electrical connector 20 will typically be located near the top of the network protector 10, facing rearward.

Figure 2:
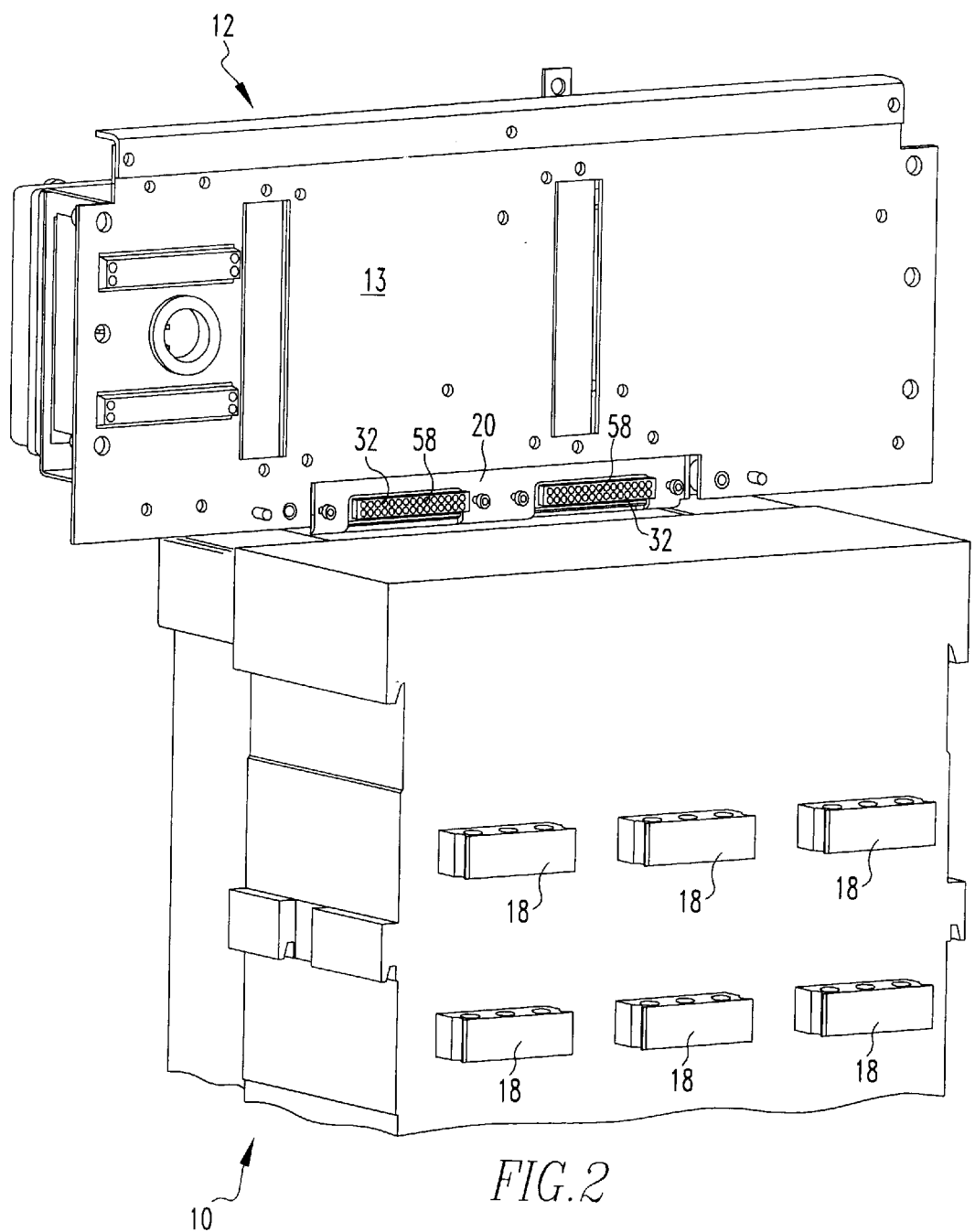
FIG. 2 is a rear isometric view of a network protector and control relay utilizing a connector of the present invention.
Figure 3:
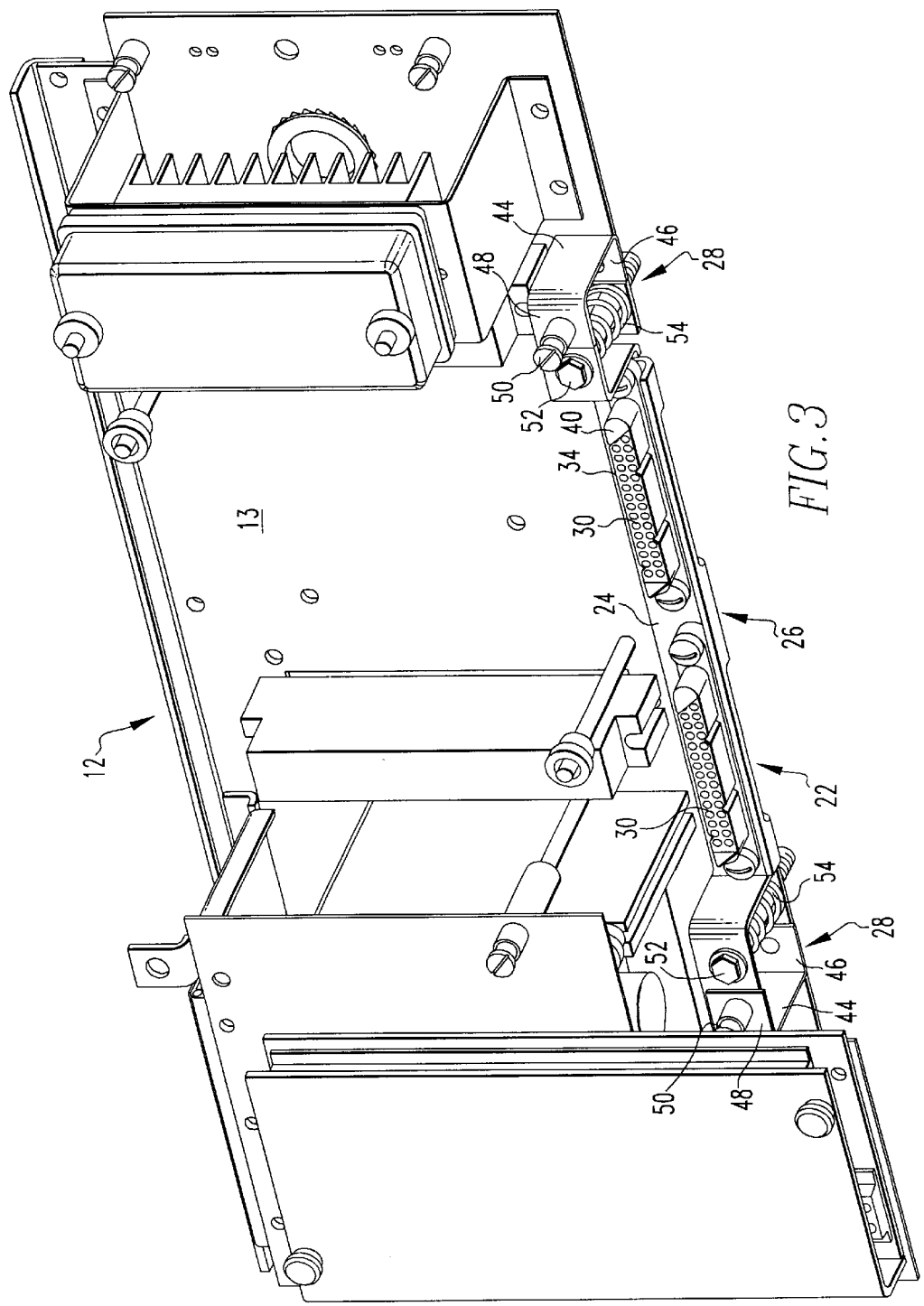
FIG. 3 is a bottom rear isometric view of a control relay having a connector according to the present invention.

The control relay panel assembly is illustrated in FIGS. 1–3. The remote control panel assembly 12 typically performs various current monitoring functions, and also communicates the status of the protected electrical circuit with a central controller, thereby providing for remote monitoring of the network protector from the central controller. The control panel assembly 12 includes a control panel 13, having an electrical connector assembly 22, for providing an electrical connection between the control relay 12 and the network protector 10.

Figure 4:
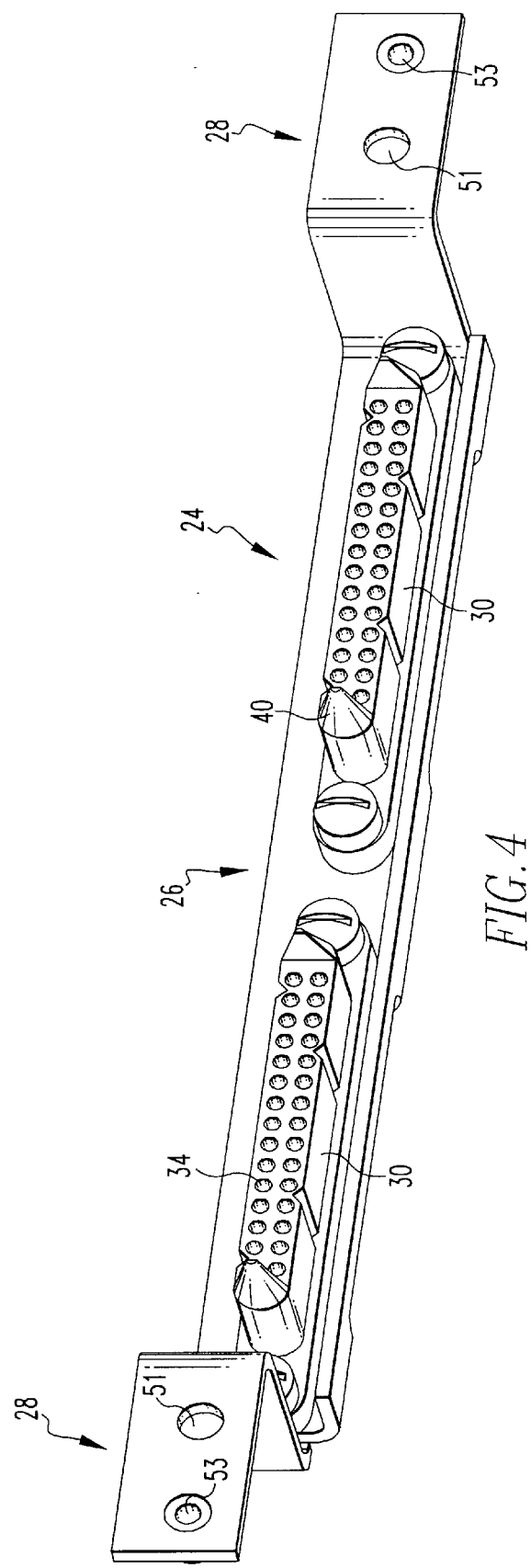
FIG. 4 is a bottom isometric view of an electrical connector bracket according to the present invention.
Figure 5:
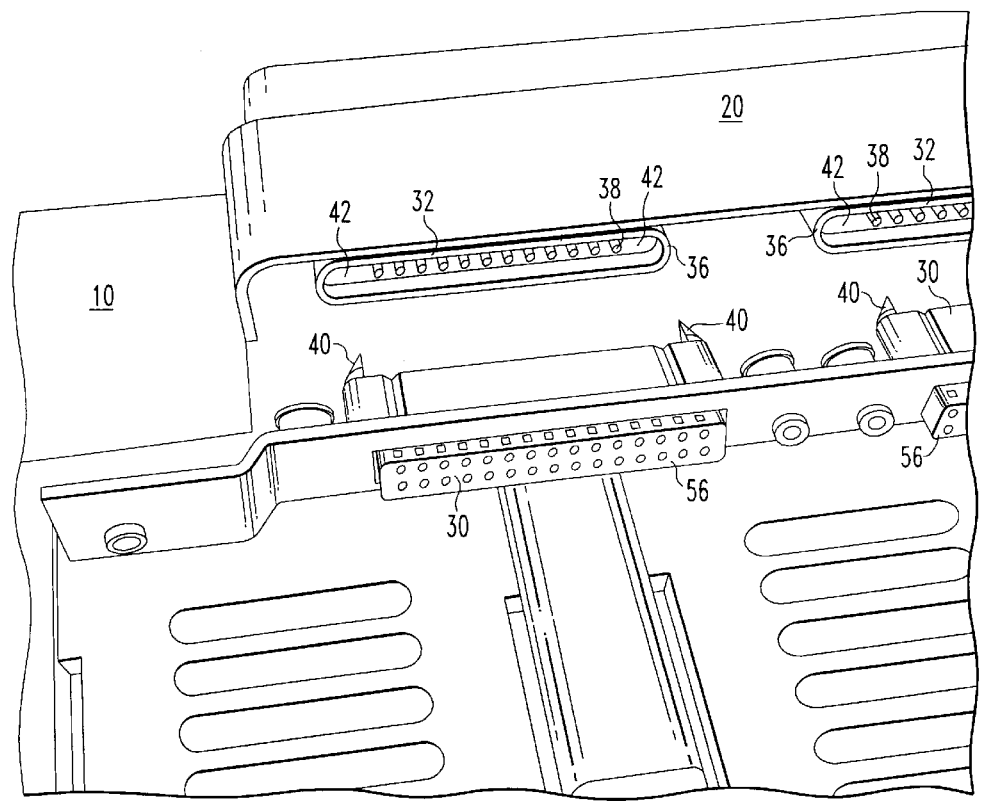
FIG. 5 is a top isometric view of a connector according to the present invention, along with its mating connector within the network protector.

The electrical connector assembly 22 is illustrated in FIGS. 3–5. The connector assembly 22 includes a connector bracket 24. The connector bracket 24 includes a central portion 26 and a pair of end portions 28. The central portion 26 of the bracket 24 includes at least one electrical connector 30, with the number of electrical connectors 30 on the bracket 24 equal in number to, and dimensioned and configured to mate with, the connectors 32 within the connector assembly 20 of the network protector. One example of such mating connectors includes mating male and female connectors, with the illustrated example having a pair of female connectors 30, mating with a pair of male connectors 32. The illustrated example female connector 30 includes a plurality of holes 34. The illustrated male connector 32 includes a wall 36 for surrounding the female connector 34, and a plurality of prongs 38, dimensioned and configured to mate with the holes 34 of the male connector 30. The female connector 30 may also include at least one alignment pin 40, dimensioned and configured to mate with a hole 42 within the male connector 32. The alignment pins 40 are preferably tapered to assisting in guiding the female connector 30 into the wall 36 of the male connector 32.

The end portions 28 of the connector bracket 24 are dimensioned and configured to be received within an end brace 44. The end braces 44 are dimensioned and configured to permit reciprocating movement of the bracket 24 between an extended, connected position and a retracted, disconnected position. The end brace 44 includes a mounting end 46 dimensioned and configured to be secured to the control relay 12, and a limiting end 48, dimensioned and configured to provide means for biasing the bracket 24 towards its retracted position. The mounting end 46 and limiting end 48 of the end brace 44 may be defined by bending the end brace 44 to form opposing perpendicular sections at the mounting end 46 and limiting end 48. The means for biasing the brace 24 towards its retracted position may include a threaded bolt 52, threadedly secured within the control relay panel assembly 12 adjacent to the end brace 44, and passing through a hole 51 within the end portion 28. A spring 54 surrounds the threaded bolt 52, providing a means for biasing the end portion 28 towards the extended position of the bracket 24. A captive screw 50 is secured within the limiting end 48 of the end brace 44, and is dimensioned and configured to engage a hole 53 within the corresponding end portion 28 when the bracket 24 is in its extended position. One example of such a captive screw is a ¼ turn captive screw.

As is well known in the art, both the female connector 30 and male connector 32 will include means for electrically connecting each of these connectors to the electrical circuitry of the control relay panel assembly 12 and network protector 10, respectively. These means will include the interior connector portions 56 of the connector assembly 22, and the interior connection portions 58 of the connector assembly 20.

Figure 6:
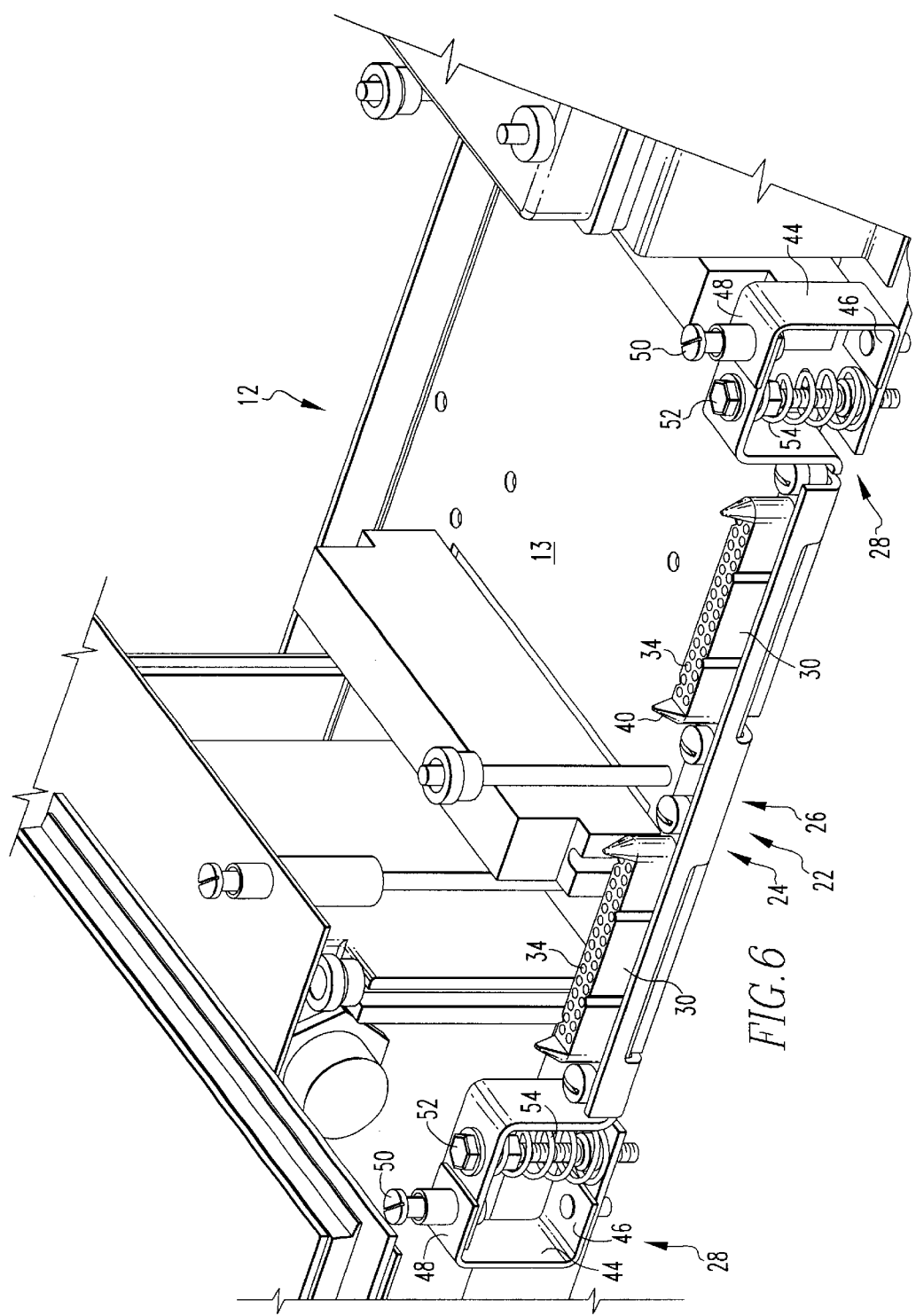
FIG. 6 is a bottom isometric view of the spring biased electrical connector according to the present invention mounted on a control relay, with the springs fully extended.
Figure 7:
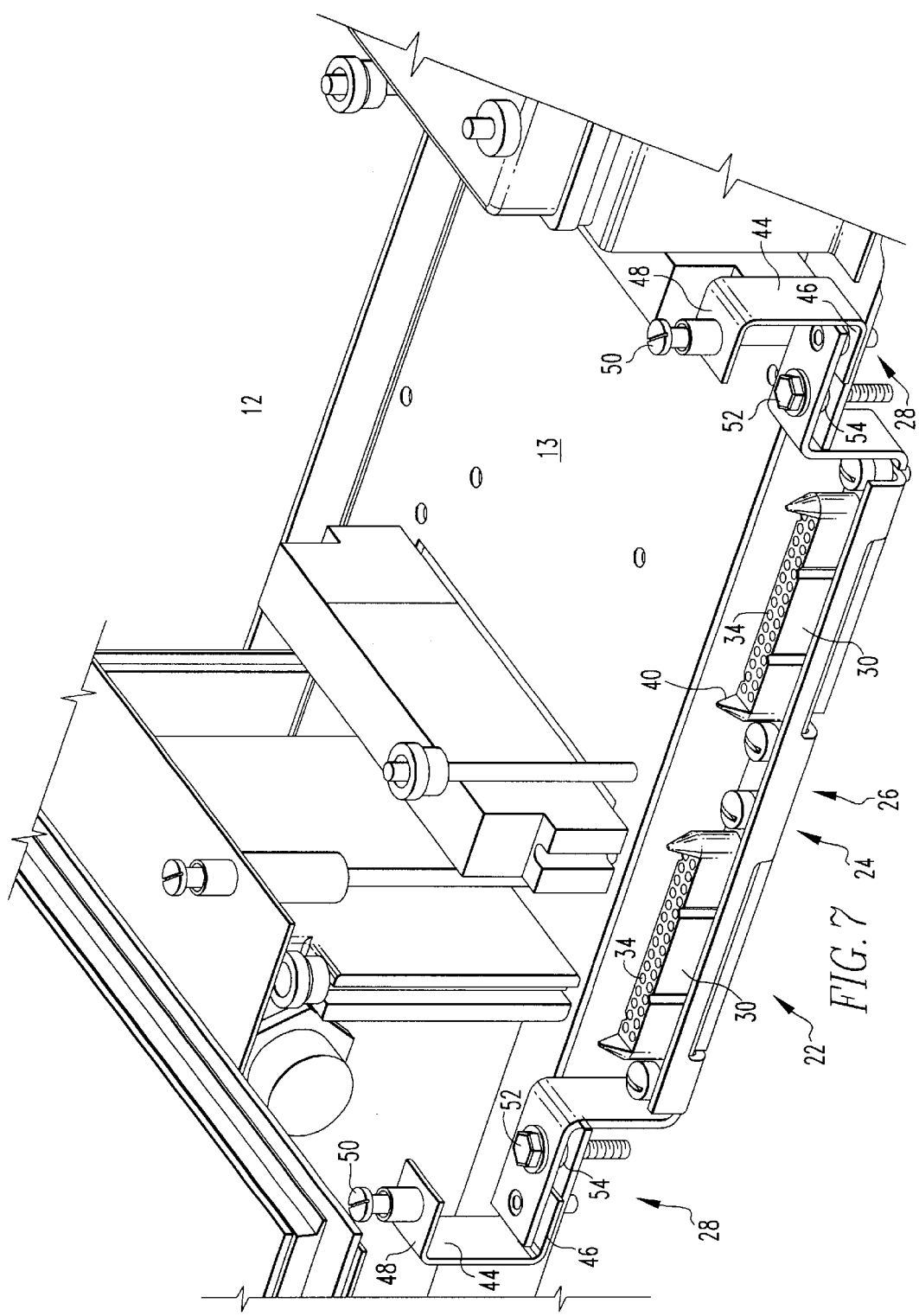
FIG. 7 is a bottom isometric view of an electrical connector of the present invention, mounted on a control relay, and having the springs compressed.
Figure 8:
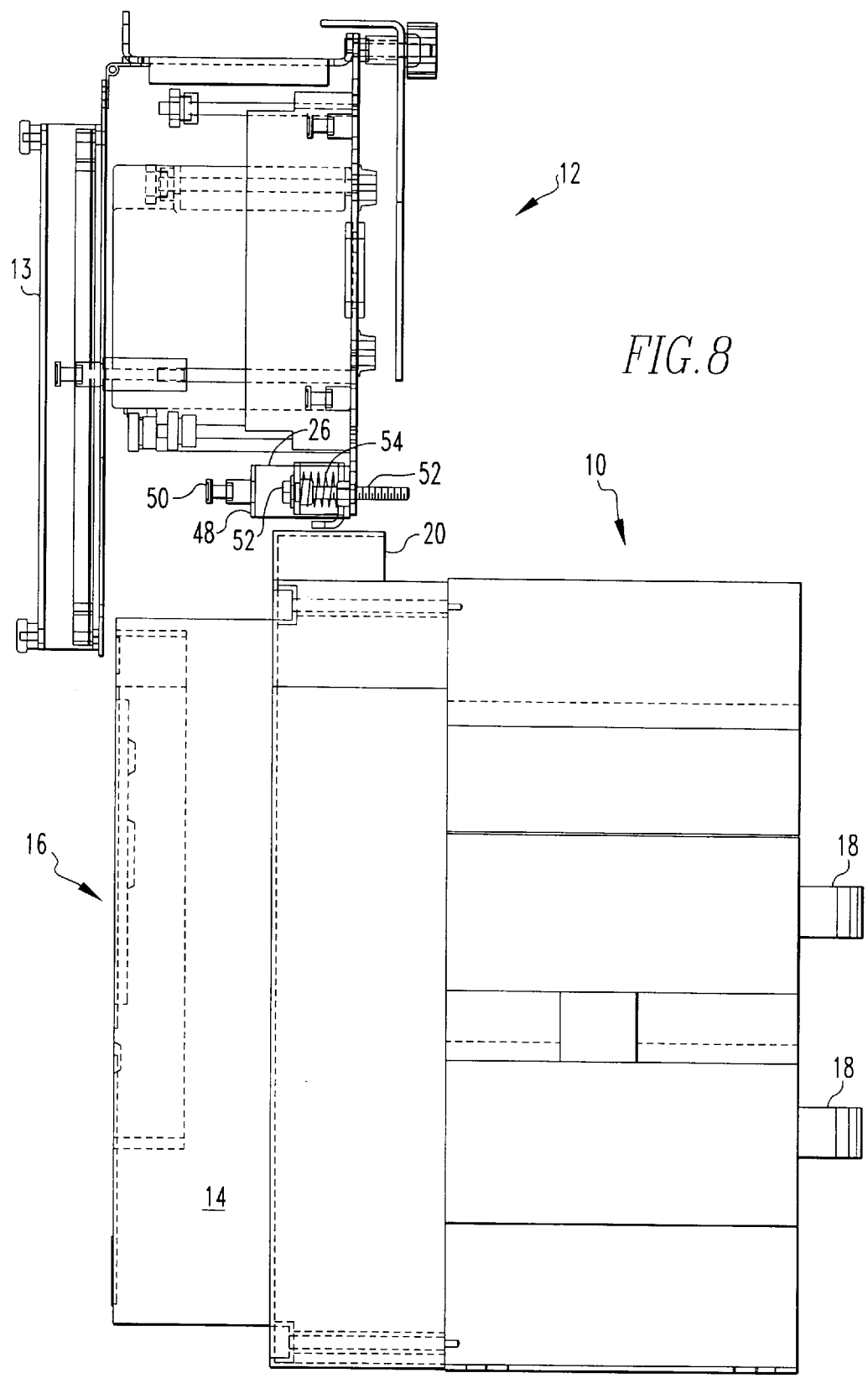
FIG. 8 is a partially exploded view of a network protector and control relay using a connector according to the present invention, showing the control relay disconnected from the network protector.

To install the control relay panel assembly 12 on the network protector 10, the electrical connector bracket 24 will typically begin in the extended position of FIG. 6, wherein the springs 54 are pushing the end portions 28 of the connector bracket 22 towards the limiting end 48 of the end brace 44. In this position, moving the control relay panel assembly 12 downward with respect to the network protector 10 would cause the electrical connector bracket 24 to strike the electrical connection assembly 20. Therefore, the bolts 52 are turned to move the end portions 28 of the electrical connector bracket 24 towards the mounting end 46 of the end brace 44, corresponding to the retracted, disconnected position of the electrical connector bracket 24. This retracted position is illustrated in FIGS. 7–8. Leaving the bolts tightened locks the connector bracket in this retracted position. When the electrical connector bracket 24 is in the retracted position, the control relay 12 may be positioned on top of the network protector 10, with the electrical connector assemblies 20, 22 aligned, without interference between the connector assemblies 20, 22. Rotating the bolts 52 to loosen the bolts, thereby permitting the springs 54 to push the bracket 24 towards its extended, connected position, thereby bringing the connectors 30 into engagement with the connectors 32 (FIGS. 1, 6, and 9). As these mating connectors are brought into engagement, the alignment pins 40 will first enter the holes 42, ensuring that the mating connectors 30, 32 are properly aligned. The tapered shape of the alignment pins 40 ensure that by the time pins 38 reach the holes 34, the mating connectors 30, 32 are perfectly aligned. The captive screws 50 may then be tightened to secure the connector bracket 24 within this extended, connected position.

Removal of the control relay panel assembly 12 from the network protector 10 is accomplished by following the opposite procedure. The captive screws 50 are first loosened to permit movement of the bracket 24, and the bolts 52 are turned to push the connector bracket 24 away from the connector assembly 20, disengaging the female connectors 30 from the male connectors 32. The connector bracket 24 is thereby moved from the extended position of FIG. 6 to the retracted position of FIG. 7. Once the connector bracket 24 is in the retracted position of FIG. 7, the control relay panel assembly 12 may be lifted upward from the network protector 10, without any interference between the mating connector assemblies 20, 22.

The network protector 10 will frequently be located in an underground electrical system, for example, beneath a busy street. A network protector in this location will typically be used in a power distribution system for transmitting electrical power to a group of residential and/or commercial buildings. Typically, the electrical distribution system will channel electrical power to the consumer through multiple network protectors, so that difficulties within a portion of a circuit protected by one network protector 10 will not interfere with power consumption. If a problem is detected in the electrical circuit protected by the network protector 10, for example, reverse current flow causing the circuit breaker 14 to trip, the control relay 12 will transmit this information to a central controller. The central controller will then record this information for retrieval by the appropriate technicians, so that any essential repairs can be performed. Other essentially identical control relays independently monitor current flow through other essentially identical network protectors 10, and adjust the current flow through their associated network protectors 10 accordingly. Current flow through each network protector will thereby be redistributed, supplying the correct amount of electrical power to the customer.

The underground locations wherein network protectors 10 are typically used are harsh environments, requiring frequent inspection and servicing of the network protectors 10 and control relays 12. An electrical connector 22 of the present invention permits the control relay 12 to be detached from the network protector 10 without the need for removal of any other components from the network protector 10, thereby simplifying inspection and repair of the control relay 12.

While a specific embodiment of the invention has been described in detail, it will be appreciated by those skilled in the art that various modifications and alternatives to those details could be developed in light of the overall teachings of the disclosure. Accordingly, the particular arrangements disclosed are meant to be illustrative only and not limiting as to the scope of the invention which is to be given the full breadth of the appended claims and any and all equivalents thereof.

What is claimed is:

1. A control relay for a network protector, the control relay comprising a control panel and a connector mounted on said control panel, said connector having means for moving said connector substantially perpendicular to said control panel between a retracted position permitting installation and removal of said control relay, and an extended position wherein said connector engages a mating connector within the network protector when said remote controller is installed on said network protector.

2. The control relay according to claim 1, wherein said means for moving said connector substantially perpendicular to said control panel between said retracted position, and said extended position comprise:

a bracket having a pair of end portions;

at least one electrical connector portion on said bracket;

means for defining said retracted position and said extended position;

means for biasing said connector towards the extended position; and means for moving said connector towards said retracted position.

3. The control relay according to claim 2, wherein said means for moving said connector towards said retracted position include a threaded bolt engaging each of said pair of end portions, and said control panel to guide said bracket between said extended and retracted positions, and lock said bracket in said retracted position.

4. The control relay according to claim 2, wherein said means for defining said retracted position and said extended position include an end brace adjacent to each of said end portions.

5. The control relay according to claim 4, wherein said means for biasing said connector towards an extended position include a spring between each of said end braces and each of said end portions.

6. The control relay according to claim 2, further comprising means for securing said connector in said extended position.

7. The control relay according to claim 6, wherein said means for securing said connector in said extended position include at least one captive screw.

8. The control relay according to claim 2, wherein said at least one electrical connector portion includes at least one alignment pin.

9. A network protector comprising a fixed connector and a control relay, the control relay comprising a control panel and a moveable connector mounted on said control panel, said moveable connector having means for moving said connector substantially perpendicular to said control panel between a retracted position permitting installation and removal of said control relay, and an extended position wherein said connector engages said fixed connector when said remote controller is installed on said network protector.

10. The network protector according to claim 9, wherein said means for moving said connector substantially perpendicular to said control panel between said retracted position, and said extended position comprise:

a bracket having a pair of end portions;

at least one electrical connector portion on said bracket;

means for defining said retracted position and said extended position;

means for biasing said connector towards the extended position; and means for moving said connector, towards said retracted position.

11. The network protector according to claim 10, wherein said means for moving said connector towards said retracted position include a threaded bolt engaging each of said pair of end portions, and said control panel to guide said bracket between said extended and retracted positions, and lock said bracket in said retracted position.

12. The network protector according to claim 10, wherein said means for defining said retracted position and said extended position include an end brace adjacent to each of said end portions.

13. The network protector according to claim 12, wherein said means for biasing said connector towards an extended position include a spring between each of said end braces and each of said end portions.

14. The network protector according to claim 10, further comprising means for securing said connector in said extended position.

15. The network protector according to claim 14, wherein said means for securing said connector in said extended position include at least one captive screw.

16. The network protector according to claim 10, wherein said at least one electrical connector portion includes at least one alignment pin.

* * * * *